United States Patent [19]

Bator et al.

[11] Patent Number: 5,001,373
[45] Date of Patent: Mar. 19, 1991

[54] ACTIVE CLAMP CIRCUIT WITH IMMUNITY TO ZENER DIODE MICROPLASMIC NOISE

[75] Inventors: Philip M. Bator, Farmington, Mich.; Rex J. Eccleston, Karben, Fed. Rep. of Germany; David J. Rutkowski, Grosse Ile, Mich.

[73] Assignee: Ford Motor Company, Dearborn, Mich.

[21] Appl. No.: 462,193

[22] Filed: Jan. 9, 1990

[51] Int. Cl.$^5$ .................. H03K 5/00; H03B 1/04; H02H 3/22

[52] U.S. Cl. .................. 307/542; 307/551; 307/318; 307/270; 361/111; 363/56

[58] Field of Search ............ 307/270, 570, 542, 544, 307/546, 547, 548, 549, 246, 551, 450, 296.5, 318, 542.1; 340/663, 660, 661, 636; 328/48; 361/91, 100, 111; 363/56

[56] References Cited

U.S. PATENT DOCUMENTS

| | | | |
|---|---|---|---|
| 3,010,031 | 11/1961 | Baker | 307/546 |
| 3,217,310 | 11/1965 | Pearson et al. | 307/660 |
| 3,249,808 | 5/1966 | Short | 315/219 |
| 3,277,312 | 10/1966 | Harris | 340/661 |
| 3,641,407 | 2/1972 | Scott | 317/43 |
| 4,096,400 | 6/1978 | Ferry et al. | 307/254 |
| 4,399,524 | 8/1983 | Muguruma et al. | 307/229 |
| 4,459,498 | 7/1984 | Stengl et al. | 307/270 |
| 4,492,883 | 1/1985 | Janutka | 307/246 |
| 4,547,686 | 10/1985 | Chen | 307/570 |
| 4,658,203 | 4/1987 | Freymuth | 323/282 |
| 4,665,459 | 5/1987 | Bynum et al. | 361/91 |
| 4,679,112 | 7/1987 | Craig | 361/33 |
| 4,695,770 | 9/1987 | Raets | 315/207 |
| 4,717,849 | 1/1988 | Shigekane | 307/549 |
| 4,750,078 | 6/1988 | Ganger | 361/111 |
| 4,894,567 | 1/1990 | Lenk | 307/542 |

OTHER PUBLICATIONS

IBM Technical Disclosure Bulletin, vol. 27, No. 11, Apr. 75, p. 6381.

Primary Examiner—Stanley D. Miller
Assistant Examiner—Toan Tran
Attorney, Agent, or Firm—Paul K. Godwin, Jr.; Roger L. May

[57] ABSTRACT

An active clamp circuit for an inductive load switching circuit includes a zener current control resistor to set the breakdown current in a zener diode of the clamp circuit. The zener breakdown current is set at a sufficiently high level to ensure that the zener diode is operated at a point beyond its "knee" region and therefore does not generate interfering levels of microplasmic nois (MPN). The zener current control resistor is provided in addition to a circuit speed control resistor such that there is substantially independent control of the switching circuit operating speed and the breakdown current of the zener diode of the active clamp circuit.

8 Claims, 1 Drawing Sheet

ACTIVE CLAMP CIRCUIT WITH IMMUNITY TO ZENER DIODE MICROPLASMIC NOISE

BACKGROUND OF THE INVENTION

The present invention relates generally to a voltage clamp circuit used in a switching circuit which switches inductive loads and, more particularly, to an improved active clamp circuit. The improved active clamp circuit includes a zener diode and permits independent control of the operating speed of the switching circuit and zener breakdown current to prevent generation of excessive levels of an electrical disturbance referred to as microplasmic noise (MPN).

When the current in an inductive load is switched off, voltage peaks or overshoot pulses, often referred to as "flyback voltage", are generated because of the voltage-current relationship for inductive loads. This flyback voltage can lead to destruction of the device which switches current to the load and also generates substantial noise which can be coupled into and interfere with operation of associated or nearby circuitry. Fortunately, flyback voltage can be dissipated or discharged in a controlled manner in one of a number of known arrangements including clamp diodes and active clamp circuits to essentially prevent generation of interfering noise levels.

In one active clamp circuit of the prior art, a conventional diode and a zener diode are connected in series, either cathode-to-cathode or anode-to-anode, across the collector-base or drain-gate of a power transistor used to switch or control an inductive load. In this circuit, the flyback voltage is advantageously clamped without an additional power device. Current due to the flyback voltage is conducted through the conventional and zener diodes to partially activate the power transistor which then provides a controlled current path through which the inductive load is discharged.

It is also often desirable to slow down the switching circuit to reduce noise which would otherwise be produced by switching on the inductive load since such noise can also interfere with operation of associated or nearby circuitry the same as noise generated by the flyback voltage. Circuit slow down is typically accomplished by increasing the resistance of a base or gate resistor of a power transistor used to switch the inductive load. Unfortunately, in the prior art active clamp circuit, the resistor also determines the zener breakdown current. Accordingly, increased resistance not only slows circuit operation but also reduces and limits the zener breakdown current.

The zener breakdown current can be reduced to current levels which are in the "knee" region of the reverse IV characteristic curve of the zener diode. When zener diodes are operated at such low currents, they produce a significant level of electrical disturbance called microplasmic noise (MPN). MPN is oscillatory noise which is the result of the zener breakdown phenomenon and is generally considered "white" noise with equal amplitude for all frequencies from about zero hertz to approximately 200 kilohertz. MPN levels decrease as zener current increases and also change with the temperature of the zener diode junction, generally increasing for low junction temperatures. MPN is sometimes specified as a zener noise density by zener diode makers, see for example the Motorola Rectifiers and Zener Diodes Data Book published by Motorola, Inc.

If MPN is generated by a zener diode used in an active clamp for a switching circuit, the MPN is coupled to the base or gate of the power transistor and amplified. The active clamp provides a closed loop path which feeds the amplified noise back to the base or gate of the power transistor and a resulting low-Q, high current oscillator circuit operates momentarily during the clamping operation.

Clamped switching circuits are often closely associated with other circuits. For example, clamped switching circuits may be included in an automotive electronic circuit module used to control an antilock braking system or other system of an automobile. Thus, switching noise including MPN in an active clamp circuit can not only adversely affect the operation of the switching circuits themselves but also be coupled into other associated circuitry and adversely affect their operation as well.

A possible solution to the MPN problem is to select a zener diode based upon the zener breakdown current which is generated in the switching circuit. However, such selection would restrict the number of available devices to those which meet the zener breakdown current specifications and are properly specified by the manufacturer. Further, it is likely that any diode so selected would be a more expensive device than otherwise required due to the more stringent specifications.

Thus, there is a need for an active clamp for a switching circuit which switches inductive loads wherein an inexpensive zener diode can be used consistently without the generation of MPN by the zener diode. It would be desirable to be able to control the operating speed of the switching circuit and also the zener breakdown current substantially independently of one another. Independent control would optimize the operation of the switching circuit, and ensure that the associated active clamp will operate properly to limit flyback voltage without generating interfering levels of MPN.

SUMMARY OF THE INVENTION

This need is met by the present invention wherein a clamp circuit for an inductive load switching circuit includes a zener current control resistor to set the breakdown current in a zener diode of the clamp circuit at a sufficiently high level to ensure that the zener diode has an operating point beyond its "knee" region and therefore will not generate substantial levels of microplasmic noise (MPN). The zener current control resistor is provided in addition to a circuit speed control resistor such that the clamp circuit of the present invention has substantially independent control of the switching circuit operating speed and the zener breakdown current.

In accordance with one aspect of the present invention, a control circuit for switching current in a load which includes an inductive reactance comprises transistor means, preferably a power MOSFET, including a control terminal and a primary current carrying path connected to the load and defined by a current input terminal and a current output terminal. The transistor means provides for switching current in the load through its primary current carrying path. First resistance means is connected to the control terminal for determining the operating speed of the control circuit. Inductive energy discharge control means is connected between the load and the control terminal for activating the transistor means to thereby provide a current path through which the load is discharged. The inductive energy discharge control means includes a zener diode which is connected to conduct a controlled amount of inductive flyback current, i.e. current due to the flyback voltage, in a reverse direction therethrough. Current control means connected to the zener diode determines the inductive flyback current therethrough. Accordingly, the speed of the control circuit and the zener breakdown current are each controlled to provide a desired operating speed and to provide sufficient zener breakdown current to effectively prevent the generation of microplasmic noise (MPN) by the zener diode.

The inductive energy discharge control means preferably further comprises a conventional diode connected in series anode-to-anode with the zener diode. The zener diode is connected to the load, the conventional diode is connected to the control terminal, and the current control means is connected to the connection between the zener diode and the conventional diode. The current control means preferably comprises second resistance means.

In accordance with a preferred embodiment, it is an object of the present invention to provide an improved active clamp circuit for a switching circuit which switches an inductive load wherein the breakdown current of a zener diode included within the clamp circuit is controlled to ensure that the zener diode does not generate excessive microplasmic noise (MPN) which can interfere with operation of the switching circuit as well as other associated circuitry.

Other objects and advantages of the invention will be apparent from the following description, the accompanying drawings and the appended claims.

DETAILED DESCRIPTION OF THE INVENTION

Figure 1:
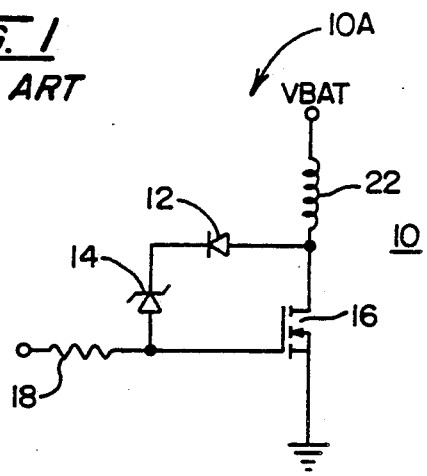
FIG. 1 is a schematic diagram of a prior art active clamp circuit.

Referring now to FIG. 1, a prior art control circuit 10 for switching an inductive load includes an active clamp circuit 10A. In the clamp circuit 10A of FIG. 1, a conventional diode 12 and a zener diode 14 are connected in series, cathode-to-cathode, across the collector-base or drain-gate of a power transistor 16. The power transistor 16, shown as a single power MOSFET transistor in FIG. 1, is used to control an inductive load 22 by applying an activating potential to first resistance means comprising a base or gate resistor 18 to switch-on the transistor 16 and hence the inductive load 22 and ground potential to switch-off the transistor 16 and hence the inductive load 22. It should be apparent that the diodes 12, 14 can also be connected anode-to-anode and that more than one power MOSFET or other type power transistor can be used, if required, to meet circuit demands.

When the load 22 is switched off, a portion of the energy of the flyback voltage determined by the resistor 18 is conducted as flyback current through the series connected diodes 12, 14 to partially activate the transistor 16. This partial activation of the transistor 16 serves to dissipate or discharge the load 22 in a controlled manner thereby preventing the generation of interfering noise upon switch-off of the load 22. When the operating speed of the switching circuit 10 including the clamp circuit 10A is to be slowed down to reduce noise generated by switch-on of the load 22, the resistor 18 is increased in resistance value. Unfortunately, an increase in the resistance value of the resistor 18 also reduces the current flow through the zener diode 14.

The current through the zener diode 14 is often reduced to such low levels that the zener diode 14 is operated in the "knee" region of its reverse IV characteristic curve. Such low current operation can result in the generation of significant microplasmic noise (MPN) by the zener diode 14. Such MPN generated by the zener diode 14 results in momentary high current oscillatory circuit operation of the clamp circuit 10A during clamping operation. This oscillatory circuit operation occurs because a positive feedback path is formed for the transistor 16 by the active clamp circuit 10A, i.e. the conventional diode 12 and the zener diode 14. The burst of noise due to the oscillatory operation of the switching control circuit 10 can be coupled into sensitive circuitry associated with the switching control circuit 10 and appear as an extraneous analog or digital input to adversely affect operation of the associated circuitry. The burst of noise, when added to the already high flyback voltage, potentially may even damage the switching control circuit 10 itself.

Figure 2:
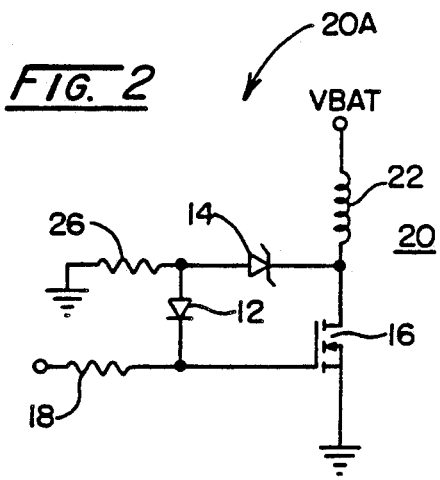
FIG. 2 is a schematic diagram of one embodiment of an improved active clamp circuit in accordance with the present invention.

FIG. 2 shows a control circuit 20 for switching an inductive load. Control circuit 20 includes a first embodiment of an improved active clamp circuit 20A in accordance with the present invention. The same identifying numerals have been used in FIG. 2 to identify corresponding elements in the control circuit 20 of FIG. 2. The active clamp circuit 20A includes current control means for determining the level of inductive flyback current which flows through the zener diode 14 substantially independently of the operating speed of the control circuit 20.

In FIG. 2, the zener diode 14 and the conventional diode 12 are connected anode-to-anode with the anodes being connected to ground potential through second resistance means, comprising a resistor 26 which operates as the current control means. As before, an activating potential is applied to the gate resistor 18 to switch-on the transistor 16 and hence the inductive load 22 and ground potential is applied to the gate resistor 18 to switch-off the transistor 16 and hence the inductive load 22. When the load 22 is switched off, a portion of the energy represented by the flyback voltage is conducted as current through the series connected diodes 12, 14 to partially activate the transistor 16. Here too, the partial activation of the transistor 16 serves to dissipate or discharge the load 22 in a controlled manner thereby preventing the generation of interfering noise upon switch-off of the load 22.

However, while the activating voltage for controlling the switch-on speed of the transistor 16 is once again set by the resistor 18, the zener breakdown current or current flow through the zener diode 14 is determined by the resistor 26, or more accurately, by the effective parallel combination of the resistor 26 and the resistor 18. When the operating speed of the switching circuit 20 including the clamp circuit 20A is slowed down to reduce noise generated by switch-on of the load 22 by increasing the resistance value of the resistor 18, the current flow through the zener diode 14 is maintained at an appropriate level to prevent the generation of significant MPN levels by selection of the resistor 26. Thus, the current through the zener diode 14 is controlled primarily by the resistor 26 and the speed of the control circuit 20 is controlled primarily by the resistor 18, substantially independently of one another.

Figure 3:
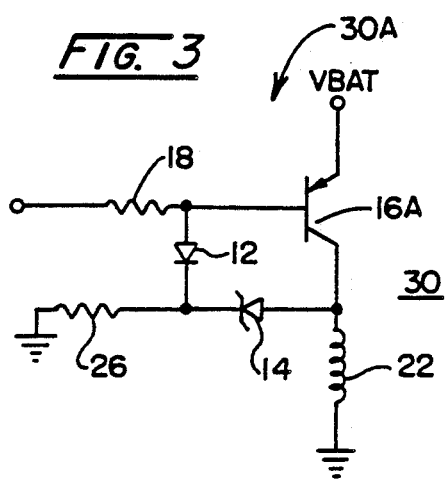
FIG. 3 is a schematic diagram of another embodiment of an improved active clamp circuit in accordance with the present invention.

FIG. 3 shows a control circuit 30 for switching an inductive load. Control circuit 30 includes a second embodiment of an improved active clamp circuit 30A in accordance with the present invention. The same identifying numerals have been used in FIG. 3 to identify corresponding elements in the control circuit 30 of FIG. 3. The active clamp circuit 30A includes current control means for determining the level of inductive current which flows through the zener diode 14 substantially independently of the operating speed of the control circuit 30. In FIG. 3, the control circuit 30 is shown as including a bipolar PNP power transistor 16A which may be preferred for some applications. In this configuration, the zener diode 14 and the conventional diode 12 are connected cathode-to-cathode with the cathodes being connected to ground potential through second resistance means comprising a resistor 26 which operates as the current control means. The current through the zener diode 14 of FIG. 3 is controlled primarily by the resistor 26 and the operating speed of the control circuit 30 is controlled primarily by, the resistor 18, substantially independently of one another as previously described.

Having described the invention in detail and by reference to preferred embodiments thereof, it will be apparent that modifications and variations are possible without departing from the scope of the invention which is defined in the appended claims:

What is claimed is:

1. A control circuit for switching current in a load which includes an inductive reactance comprising:
    transistor means including a control terminal and a primary current carrying path defined by a current input terminal and a current output terminal for switching current in the load through said primary current carrying path which is connected to the load;
    first resistance means connected to said control terminal for determining the operating speed of said control circuit;
    inductive energy discharge control means connected between the load and said control terminal for activating said transistor means to thereby provide a current path through which the load is discharged, said inductive energy discharge control means including a zener diode connected to conduct inductive flyback current in a reverse direction therethrough; and
    current control means connected between said zener diode and a ground potential for determining the inductive flyback current through said zener diode whereby the speed of said control circuit and the zener breakdown current are each controlled to provide a desired operating speed and sufficient zener breakdown current to prevent the generation of microplasmic noise by the zener diode.

2. A control circuit for switching current in a load which includes an inductive reactance as claimed in claim 1 wherein said inductive energy discharge control means further comprises a conventional diode connected to said zener diode, said conventional diode and said zener diode being connected in series anode-to-anode or cathode-to-cathode between said load and said control terminal, and said current control means being connected to said zener diode at the connection between said conventional and zener diodes.

3. A control circuit for switching current in a load which includes an inductive reactance as claimed in claim 1 wherein said transistor means comprises at least one power MOSFET.

4. A control circuit for switching current in a load which includes an inductive reactance as claimed in claim 3 wherein said inductive energy discharge control means further comprises a conventional diode connected in series anode-to-anode with said zener diode, said zener diode being connected to said load, said conventional diode being connected to said control terminal, and said current control means being connected to said zener diode at the connection between said zener diode and said conventional diode.

5. A control circuit for switching current in a load which includes an inductive reactance as claimed in claim 3 wherein said inductive energy discharge control means further comprises a conventional diode connected in series cathode-to-cathode with said zener diode, said zener diode being connected to said load, said conventional diode being connected to said control terminal, and said current control means being connected to said zener diode at the connection between said zener diode and said conventional diode.

6. A control circuit for switching current in a load which includes an inductive reactance as in claim 1 wherein said current control means comprises second resistance means.

7. A control circuit for switching current in a load which includes an inductive reactance comprising:
    at least one MOSFET power transistor having a gate terminal and a primary current carrying path, said primary current carrying path being defined by a source terminal connected to the load and a drain terminal connected to ground potential for switching current in the load through said primary current carrying path;
    a first resistor connected to said gate terminal for determining the operating speed of said control circuit;
    a zener diode connected to the load to conduct inductive flyback current in a reverse direction from the load through said zener diode;
    a conventional diode connected between said zener diode and the connection of said first resistor and said gate terminal for conducting inductive flyback current in a forward direction from said zener diode through said conventional diode; and
    a second resistor connected between the connection of said zener diode and said conventional diode and ground potential for setting the current flow through said zener diode whereby the speed of said control circuit and the current through said zener diode are each controlled to provide a desired operating speed and sufficient current through said zener diode to prevent the generation of microplasmic noise thereby.

8. A control circuit for switching current in a load which includes an inductive reactance comprising:
    at least one power transistor having a control terminal and a primary current carrying path for switching current in the load through said primary current carrying path which is connected to the load;

a first resistor connected to said control terminal for determining the operating speed of said control circuit;

a zener diode connected to the load to conduct inductive flyback current in a reverse direction from the load through said zener diode;

a conventional diode connected between said zener diode and the connection of said first resistor and said control terminal for conducting inductive flyback current in a forward direction from said zener diode through said conventional diode; and a second resistor connected between the connection of said zener diode and said conventional diode and ground potential for setting the current flow through said zener diode whereby the speed of said control circuit and the current through said zener diode are each controlled to provide a desired operating speed and sufficient current through said zener diode to prevent the generation of microplasmic noise thereby.

* * * * *